US009595585B2

(12) United States Patent
Mao

(10) Patent No.: US 9,595,585 B2
(45) Date of Patent: Mar. 14, 2017

(54) METHODS FOR HIGH-K METAL GATE CMOS WITH SIC AND SIGE SOURCE/DRAIN REGIONS

(71) Applicants: Semiconductor Manufacturing International (Beijing) Corporation, Beijing (CN); Semiconductor Manufacturing International (Shanghai) Corporation, Shanghai (CN)

(72) Inventor: Gang Mao, Shanghai (CN)

(73) Assignees: Semiconductor Manufacturing International (Beijing) Corporation (CN); Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/491,853

(22) Filed: Sep. 19, 2014

(65) Prior Publication Data
US 2016/0087040 A1 Mar. 24, 2016

(51) Int. Cl.
*H01L 21/70* (2006.01)
*H01L 21/332* (2006.01)
(Continued)

(52) U.S. Cl.
CPC ...... *H01L 29/165* (2013.01); *H01L 29/66545* (2013.01); *H01L 29/66553* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
(Continued)

(56) References Cited

U.S. PATENT DOCUMENTS

2009/0001420 A1\* 1/2009 Matsumoto ..... H01L 21/823807
257/190
2012/0043614 A1\* 2/2012 Choi ................... H01L 27/0629
257/369
(Continued)

*Primary Examiner* — Selim Ahmed
*Assistant Examiner* — Moin Rahman
(74) *Attorney, Agent, or Firm* — Kilpatrick Townsend & Stockton, LLP

(57) ABSTRACT

A method of manufacturing a semiconductor device includes forming a PMOS region and an NMOS region in a semiconductor substrate, forming dummy gate structures in the PMOS and NMOS regions, and forming a gate hard mask layer overlying top portions and sidewalls of the dummy gate structures. The method includes forming silicon carbon regions embedded in the semiconductor substrate on both sides of the dummy gate structure in the NMOS region, removing the hard mask layer on top of the dummy gate in the NMOS region, and forming silicon germanium regions embedded in the semiconductor substrate on both sides of the dummy gate structure in the PMOS region. After forming the silicon carbon regions and the silicon germanium regions, while retaining the hard mask layer on top of the dummy gates in the PMOS region, performing ion implant to form source/drain regions in the NMOS region and the PMOS region.

20 Claims, 8 Drawing Sheets

(51) Int. Cl.
*H01L 29/165* (2006.01)
*H01L 29/66* (2006.01)

(58) Field of Classification Search
USPC .......... 257/20, 194, 135–136, 213–413, 900,
257/902–903; 438/136, 137, 156, 173,
438/192, 206, 212, 424, 427, 428, 591
See application file for complete search history.

(56) References Cited

U.S. PATENT DOCUMENTS

| | | | | |
|---|---|---|---|---|
| 2012/0241868 | A1* | 9/2012 | Tsai | H01L 21/823807 |
| | | | | 257/369 |
| 2013/0102138 | A1* | 4/2013 | Yeh | H01L 21/823807 |
| | | | | 438/585 |
| 2014/0273368 | A1* | 9/2014 | Hung | H01L 29/6656 |
| | | | | 438/230 |

* cited by examiner

METHODS FOR HIGH-K METAL GATE CMOS WITH SIC AND SIGE SOURCE/DRAIN REGIONS

BACKGROUND OF THE INVENTION

Embodiments of present invention relate to semiconductor manufacturing processes. More particularly, embodiments of the present invention provide improved methods to realize a high-k metal gate device structure.

In the next generation of integrated circuit manufacturing process, complementary metal oxide semiconductor (CMOS) devices are often implemented in a high-k metal gate device structure. An example of such process includes forming dummy gate structures on a first semiconductor substrate. The dummy gate structure includes a sacrificial gate layer and a sacrificial gate dielectric material layer. A silicon germanium (SiGe) layer is embedded in the semiconductor substrate on both sides of the dummy gate of the PMOS portion, and then a silicon carbon (SiC) layer is embedded on a semiconductor substrate on both sides of the dummy gate structure of the NMOS portion of the CMOS. Then, after spacers are formed, ion implantation is carried out to form source/drain regions in the PMOS and NMOS regions. Subsequently, the dummy gate structures are replaced by the high-k metal gate structure, which includes a high-k gate dielectric and a metal gate.

BRIEF SUMMARY OF THE INVENTION

The inventors of this disclosure have identified many limitations to the conventional high-k metal gate process described above. For example, in the conventional process, during source/drain implant, the sacrificial gate electrode material in the PMOS region are implanted with P+ dopant ions, and the sacrificial gate electrode material in the NMOS region are implanted with N+ dopant ions. In the process of removing the dummy gate structures, substantial difference in removal rates of heavily P+ doped PMOS sacrificial gate electrode material and heavily N+ doped NMOS sacrificial gate electrode material. The P+ doped PMOS sacrificial gate electrode material can become much harder to remove, thus, causing dummy gate residue in PMOS region while NMOS dumm gate incompletely removed.

In embodiments of the present invention, a high-k metal gate process is provided in which the hard mask on the PMOS dummy gate structures are retained during source/drain implant. As a result, the spacer material layer can be reduced to lower the process cost. This process also reduces the difference in removal rates of sacrificial gate electrode material in the NMOS region and the PMOS region, simplifying the process flow and improving device performance.

According to an embodiment of the present invention, a method of manufacturing a semiconductor device includes forming a PMOS region and an NMOS region in a semiconductor substrate, forming a dummy gate structure in each of the PMOS region and NMOS region, and forming a gate hard mask layer overlying top portions and sidewalls of each of the dummy gate structures. The method includes forming silicon carbon (SiC) regions embedded in the semiconductor substrate on both sides of the dummy gate structure in the NMOS region, removing the hard mask layer on top of the dummy gate in the NMOS region, and forming silicon germanium (SiGe) regions embedded in the semiconductor substrate on both sides of the dummy gate structure in the PMOS region. After forming the silicon carbon regions and the silicon germanium regions, while retaining the hard mask layer on top of the dummy gate in the PMOS region, performing ion implant to form source/drain regions in the NMOS region and the PMOS region, respectively.

In an embodiment of the above method, the gate hard mask layer comprises nitride or oxynitride.

In another embodiment, forming silicon carbon regions includes forming a first sacrificial layer overlying the dummy gate structures, patterning a photoresist layer to expose the NMOS region, etching grooves in the semiconductor substrate on both sides of the dummy gate structure in the NMOS region, removing the photoresist layer, and forming silicon carbon in the grooves using epitaxial growth.

In another embodiment, the first sacrificial layer includes a first nitride layer over an oxide layer.

In another embodiment, the method also includes forming a first cap layer over the silicon carbon regions.

In another embodiment, the first cap layer comprises silicon.

In another embodiment, the method also includes, after forming the silicon carbon regions, using a wet etching process to remove the gate hard mask layer on the dummy gate structure in the NMOS region and the nitride layer in the first sacrificial layer [A1].

In another embodiment, forming silicon germanium regions includes forming a second nitride layer overlying the dummy gate structures, patterning a photoresist layer to expose the PMOS region, etching Σ-shaped grooves in the semiconductor substrate on both sides of the dummy gate structure in the PMOS region, wherein the etching process includes dry etch, removing the photoresist layer and wet etch, and forming silicon germanium in the Σ-shaped grooves using epitaxial growth.

In another embodiment, the method also includes a seed layer formed on the bottom of the Σ-shaped grooves before forming silicon germanium in the Σ-shaped grooves.

In another embodiment, the method also includes forming a second cap layer over the silicon germanium regions.

In another embodiment, the second cap layer comprises silicon or boron-silicon.

In another embodiment, said embedded silicon germanium layer is doped with boron, and the embedded silicon carbon layer is doped with phosphorus.

In another embodiment, the method also includes prior to the source/drain implantation, etching in the second nitride layer in the NMOS region to expose the region between dummy gate and the top of the dummy gate structure, and forming spacers.

In another embodiment, the spacers comprise the same material as the second nitride layer.

In another embodiment, said dummy gate structure comprises a sacrificial gate layer over a sacrificial gate dielectric layer.

In another embodiment, the method also includes after the source/drain implantation, removing the dummy gate structure and forming a high-k dielectric and metal gate structure.

In another embodiment, a high-k dielectric and metal gate structure comprises a high-k dielectric layer, a cover layer, a work function setting layer, a barrier layer, and a metal gate material layer.

According to another embodiment of the present invention, a method of manufacturing a semiconductor device includes forming a PMOS region and an NMOS region in a semiconductor substrate, forming a dummy gate structure in each of the PMOS region and NMOS region, a first portion of a hard mask being disposed on top of the dummy gate structure, and forming a second portion of the hard mask layer on sidewalls of each of the dummy gate structures. The method also includes forming a first sacrificial layer covering the PMOS region and NMOS dummy gate sidewall, and forming silicon carbon (SiC) regions embedded in the semiconductor substrate on both sides of the dummy gate structure in the NMOS region. The method further includes removing the first nitride layer and the hard mask layer on top of the dummy gate in the NMOS region, forming a second nitride layer covering the NMOS region and PMOS dummy gate sidewall, and forming silicon germanium (SiGe) regions embedded in the semiconductor substrate on both sides of the dummy gate structure in the PMOS region. The method also includes removing the second nitride layer from the NMOS region, and then, while retaining the hard mask layer on top of the dummy gate in the PMOS region, performing ion implant to form source/drain regions in the NMOS region and the PMOS region, respectively.

In another embodiment of the above method, a single wet etch process is used to remove the first nitride layer and the hard mask layer on top of the dummy gate in the NMOS region.

According to another embodiment of the present invention, a method of manufacturing a semiconductor device includes forming a PMOS region and an NMOS region in a semiconductor substrate, forming a dummy gate structure in each of the PMOS region and NMOS region. The method includes forming a hard mask layer overlying top portions and sidewalls of each of the dummy gate structures, wherein a first portion of the gate hard masking layer is deposited over the sacrificial gate electrode material, and then the sacrificial gate electrode is etched and patterned. And then a second gate hard mask layer is deposited and etched to form offset spacers on both sides of the dummy gate structure. The method also includes forming a first sacrificial layer covering the PMOS region and NMOS dummy gate sidewall, and forming silicon carbon (SiC) regions embedded in the semiconductor substrate on both sides of the dummy gate structure in the NMOS region. The method further includes removing the first nitride layer and the hard mask layer on top of the dummy gate in the NMOS region, forming a second nitride layer covering the NMOS region and PMOS dummy gate sidewall, and forming silicon germanium (SiGe) regions embedded in the semiconductor substrate on both sides of the dummy gate structure in the PMOS region. The method also includes removing the second nitride layer from the NMOS region, and then, while retaining the hard mask layer on top of the dummy gate in the PMOS region, performing ion implant to form source/drain regions in the NMOS region and the PMOS region, respectively.

A further understanding of the nature and advantages of the present invention may be obtained by reference to the remaining portions of the specification and the drawings.

DETAILED DESCRIPTION OF THE INVENTION

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

FIGS. 1A-1G are cross-sectional views showing a method for forming semiconductor devices according to an exemplary embodiment of the present invention.

Figure 1A:
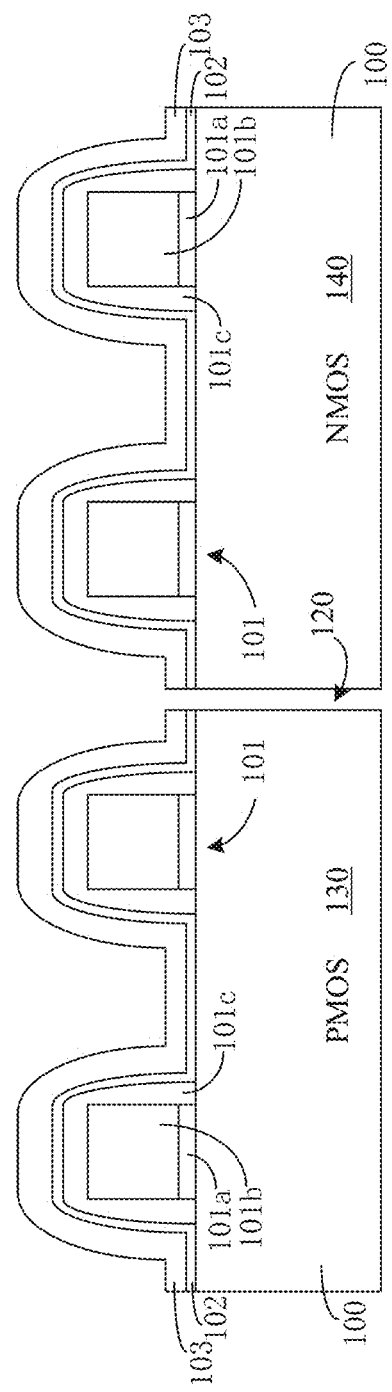
FIGS. 1A-1G are cross-sectional views showing a method for forming semiconductor devices according to an exemplary embodiment of the present invention.

First, as shown in FIG. 1A, a PMOS device and an NMOS device are formed in a semiconductor substrate 100. Semiconductor substrate 100 can include such material as undoped silicon, doped with impurities of silicon, silicon on insulator (SOI), stacked insulator silicon (SSOI), silicon-germanium-on-insulator laminate (S—SiGeOI), silicon-germanium-on-insulator (SiGeOI) and germanium on insulator (GeOI), and the like. Merely as an example, in the present embodiment the semiconductor substrate is single crystal silicon material. Formed in the semiconductor substrate 100 is an isolation structure 120, for example, a shallow trench isolation structure is isolation (STI) structures. Alternatively, a local oxidation of silicon (LOCOS) isolation structure can also be used. Semiconductor substrate 100 is divided into a PMOS region 130 and an NMOS region 140. Each region can include is various well structures, which, in order to simplify the illustration, are omitted from the drawings.

As shown in FIG. 1A, dummy gate structures 101 are formed in the NMOS region the PMOS region. As an example, the dummy gate structure 101 includes a sacrificial gate dielectric layer 101a and a sacrificial gate material layer 101b. Sacrificial gate dielectric material layer 101a is preferably a silicon oxide. Sacrificial gate electrode layer 101b can be made of polysilicon or amorphous silicon. These layers can be formed using known techniques, which are not described here.

Further, as an example, a gate hard mask layer 101c is formed on the top and sidewalls of the dummy gate structure, respectively. The gate hard mask layer can be made of materials include a nitride or oxynitride, for example, silicon nitride (SiN) or silicon oxynitride (SiON). The gate hard mask layer 101c may be formed by any conventional methods such as chemical vapor deposition (CVD), low temperature chemical vapor deposition (LTCVD), low pressure chemical vapor deposition (LPCVD), rapid thermal chemical vapor deposition (RTCVD), atomic layer deposition (ALD), or plasma enhanced chemical vapor deposition (PECVD). Gate hard masking layer 101c is used to protect the dummy gate structures against damages caused by subsequent embedding of silicon germanium or silicon carbon. In some embodiments, a first portion of the gate hard masking layer is deposited over the sacrificial gate electrode material and then pattern and etch the sacrificial gate electrode. And then a second gate hard mask layer is deposited and etched to form offset spacers on both sides of the dummy gate structures. Thus, the resulting gate hard masking layer 101c covers the top and sidewalls of the dummy gate structures, but exposes the surface of the semiconductor substrate between the dummy gate structures. In still other embodiments, the gate hard mask is formed only on top of the dummy gate structures, but not on the sidewalls.

As shown in FIG. 1A, portions of the gate hard mask layers are formed as spacers. LDD (lightly doped drain) implantation is performed using the gate hard mask layer as a mask to form LDD implant regions in the semiconductor substrate 100 on both sides of the dummy gate structure 101. In order to simplify the illustration, the LDD regions are omitted in the drawings. During LDD implantation, the gate hard mask layer 101c is used to prevent implantation into the sacrificial gate material layer 101b and to control the distance of LDD regions extending into the channel regions.

Next, a sacrificial layer is formed on the semiconductor substrate 100 to completely cover the dummy gate structures 101. As an example, the sacrificial layer includes a nitride layer 103 stacked on an oxide layer 102. In an embodiment, the thickness of oxide layer 102 is 0.5-10 nm, and the thickness of the first nitride layer 103 is 1-30 nm. The first nitride layer 103 material is preferably silicon nitride. The sacrificial layer can be formed using known processes. The sacrificial layer is used to prevent silicon carbon from forming in the PMOS region.

Figure 1B:
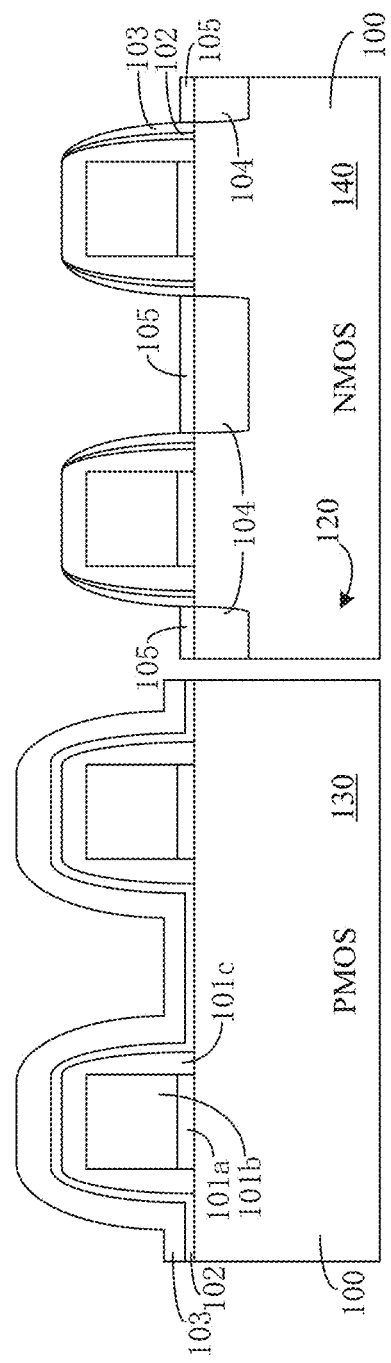

Subsequently, as shown in FIG. 1B, silicon carbon regions 104 are formed embedded in the semiconductor substrate in the NMOS region on both sides of the dummy gate structure 100. In an embodiment, the process includes forming a first patterned photoresist layer to expose the NMOS regions, using anisotropic etch to form grooves for forming the source/drain regions, using ashing to remove the photoresist, and using an epitaxial process to form silicon carbon in the source/drain regions. As an example, the depth of the grooves can be 2-80 nm. The carbon content in the silicon carbon regions can be 0.5-3%, and the thickness of the silicon carbon regions can be 3-100 nm. The epitaxial growth process may be by low pressure chemical vapor deposition, plasma enhanced chemical vapor deposition, ultra-high vacuum chemical vapor deposition, rapid thermal chemical vapor deposition, or molecular beam epitaxy, etc.

Next, a first cap layer 105 is formed on top of the embedded silicon carbon regions 104 using epitaxial growth to be used to form silicide in subsequent interconnect formation processes. As an example, first cap layer 105 includes silicon and has a thickness in the range of 1-10 nm.

Figure 1C:
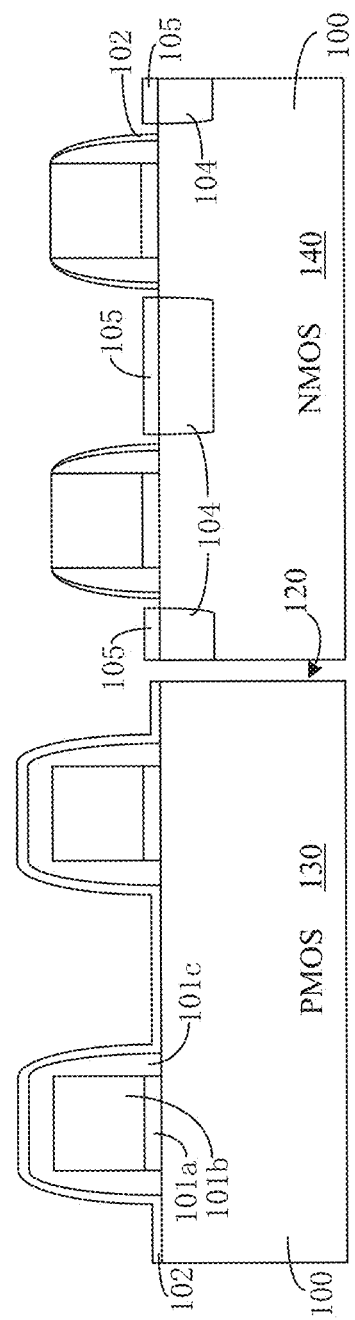

Subsequently, as shown in FIG. 1C, the portion of hard mask layer 101c on the dummy gate structures in the NMOS region is removed. In this process, the sacrificial layer of a first nitride layer 103 is also removed. In an embodiment, a wet etching process is used.

Figure 1D:
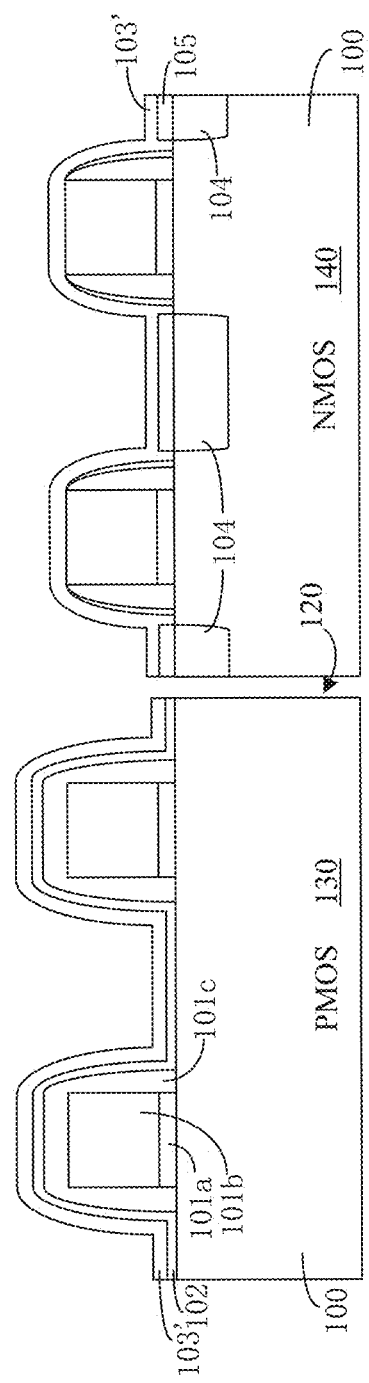

Subsequently, as shown in FIG. 1D, a second nitride layer 103' is formed on the dummy gate structures. As an example, the second nitride layer is a silicon nitride and has a thickness of 5-50 nm. The second nitride layer can be formed using a known process, e.g., a chemical vapor deposition process.

Figure 1E:
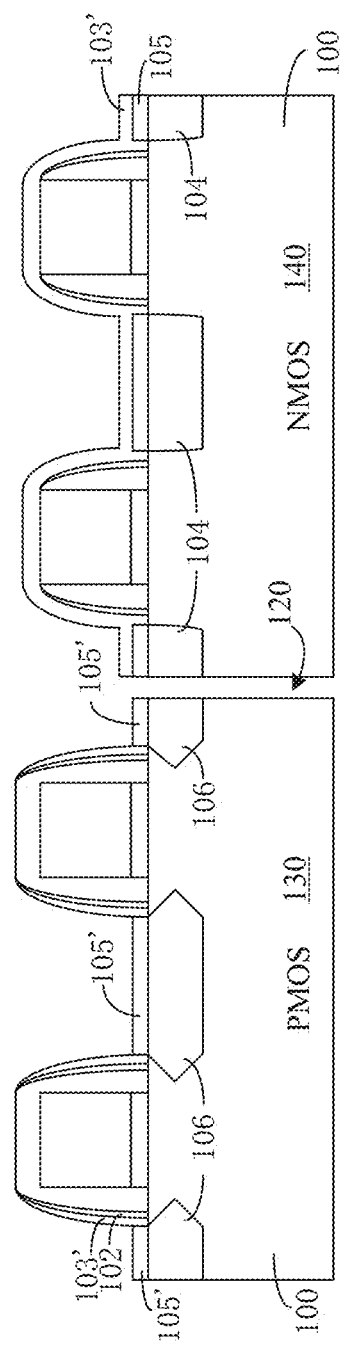

Subsequently, as shown in FIG. 1E, an embedded silicon germanium layer 106 is formed in the PMOS region of the semiconductor substrate on both sides of the dummy gate structures. In an embodiment, the process includes forming a second patterned photoresist layer to expose the PMOS regions, using first a dry etch and then a wet etch to form Σ-shaped grooves for forming the source/drain regions. In an embodiment, the specific steps of the process include forming grooves in the semiconductor substrate using a dry etching process on both sides of the dummy gate structures in the PMOS region. The dry etch chemistry includes CF4 and HBr, with a temperature of 40-60° C., a power of 200-400 W, and a bias of 50-200V. Then, an isotropic etching process is used to continue etching the grooves to form recessed sidewalls in the grooves. The recessed sidewalls can have an oval shape or a bowl shape. In an embodiment, the isotropic etching process includes Cl2 and NF3 as etching gases, with a temperature of 40-60° C., a power of 100-500 W, and a bias of 0-10V. The etch times for the anisotropic and isotropic etches are selected according to the desired the depth of the grooves and the shape of the recess. Next, an ashing process is used to remove the second photoresist layer. Finally, a wet etching process is used to etch the bowl-shaped recesses extend to the Σ-shaped grooves as shown in FIG. 1E. In an embodiment, the temperature of the wet etching is 30-60° C., the time depends on the desired size of the Σ-shaped recess, for example, 100-300 s, using tetramethyl ammonium hydroxide (TMAH) solution as an etchant of the wet etching.

An epitaxial growth process is used for forming a silicon germanium regions 106 embedded in the Σ-shaped grooves. As an example, embedded silicon germanium layer 106 can have Ge content of 5-30% atomic percent, a thickness of 5-100 nm. The epitaxial growth process may be by low pressure chemical vapor deposition, plasma enhanced chemical vapor deposition, ultra-high vacuum chemical vapor deposition, rapid thermal chemical vapor deposition, or molecular beam epitaxy. In some embodiments, before the embedded silicon germanium layer 106 is formed, a seed layer may be formed at the bottom of the Σ-shaped, which is omitted in the drawings in order to simplify the illustration. The seed layer can be formed with a variety of suitable processes, for example, a selective epitaxial growth process. In some embodiments, the seed layer may be a silicon-germanium layer having low germanium content.

Next, as shown in FIG. 1E, a second cap layer 105' is formed using an epitaxial growth method or a deposition method on top of the embedded silicon germanium layer 106. The second cap layer is used in subsequent self-aligned silicide and to prevent stress release of the silicon germanium regions subsequent processes. As an example, the second cap layer 105' has a thickness in the range of 1-10 nm. The material for the second cap layer can be a silicon or silicon boron material. The silicon boron material can have a boron concentration of $5.0 \times e^{14}$-$5.0 \times e^{20}$ atom/cm$^2$. Note that the embedded silicon germanium layer 106 may be doped with boron, and the embedded silicon carbon layer 104 may be doped with phosphorus.

Figure 1F:
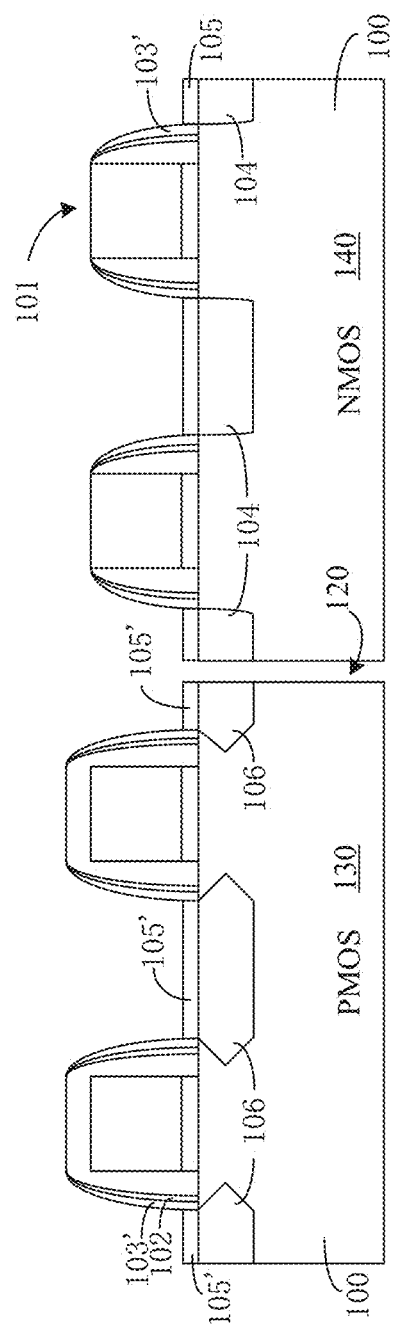

Subsequently, as shown in FIG. 1F, the second nitride layer on the NMOS region 103' is etched to expose the region between dummy NMOS gate 101 and the top of the dummy NMOS gate structure 101. The etching process includes forming a third patterned photoresist layer on semiconductor substrate 100 to expose only the NMOS region, using dry etching process to etch the second nitride layer on the NMOS region 103', and using an ashing process to remove the third photoresist layer.

Figure 1G:
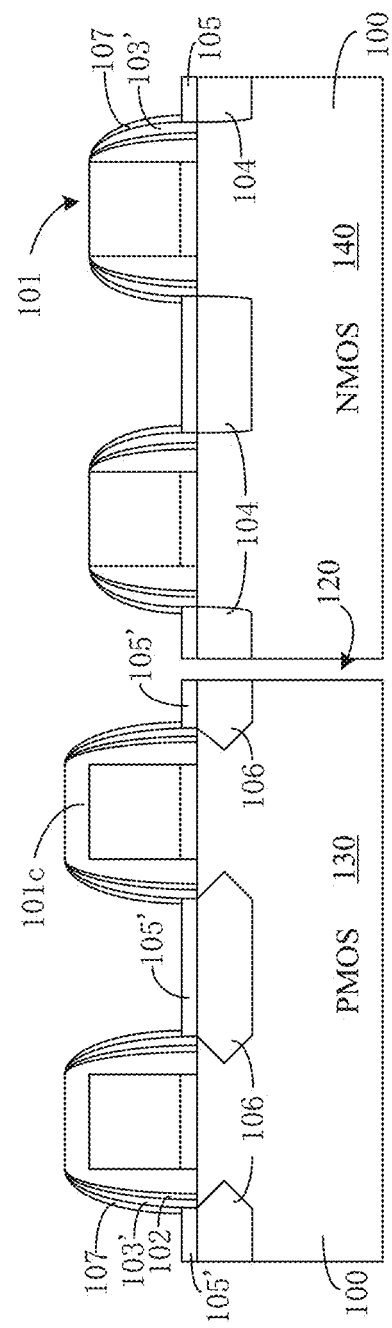

As shown in FIG. 1G, spacers 107 are formed on both sides of dummy gate structures in both the PMOS region and the NMOS region. Here, a spacer material is formed overlying the dummy gate structures. The spacer material can be the same material as the second nitride layer 103', for example, silicon nitride. Then, a blanket etch process is performed to form spacers 107. As shown in FIG. 1G, the spacers on both sides of the dummy gate structure include the oxide layer 102, second nitride layer 103', and spacer material layer 107.

In the conventional processes, the embedded silicon germanium layer is formed first and then the embedded silicon carbon layer is formed. In embodiments of the present invention, the embedded silicon carbon regions 104 are first formed in the NMOS region, and then the embedded silicon germanium regions 106 are formed in the PMOS region sequence. In this process, the hard mask layer 101c located at the dummy gate structures in the PMOS region needs not be removed. As result, the thickness of the material for forming spacer layer 107 can be reduced to reduce process cost.

Next, ion implant processes are carried out to form the source/drain regions in the NMOS region and the PMOS region, which, for simplicity, are not shown in the illustration. A conventional ion implantation process can be here. As explained above, in a conventional process, the top of sacrificial gate electrode material in both the PMOS region and the NMOS regions are exposed to the heavy source/drain ions during source/drain ion implantation. As a result, the removal rate of the heavily implanted sacrificial gate electrode material in the PMOS region is substantially lower than the removal rate of the heavily implanted sacrificial gate electrode material in the NMOS region. This difference increases the process complexity and cost.

In contrast, as shown in FIG. 1G, during the source/drain implant, the top of the dummy gate structure 101 in the PMOS region is protected by hard protective masking layer 101c. Therefore, the sacrificial gate material layer 101b in the PMOS region is not exposed to P+ dopant ions. As result, the subsequent removal of the sacrificial gate electrode material layer 101b located NMOS region and the PMOS region can proceed at similar rates. The problem of significantly different removal rates of the sacrificial gate electrode material in the PMOS region and the NMOS region can be avoided.

After the source/drain formation, high-k metal-gate structures can be formed to replace the dummy gate structures in the NMOS region and a PMOS region. As an example, the high-k metal-gate stack structure can include a high k dielectric layer, a cover layer, a work function setting metal layer, a barrier layer, and a metal gate material layer. In order to simplify the illustration, these structures are not shown in the drawings. The high-k dielectric material layer can include one or more of hafnium oxide, hafnium silicon oxide, silicon oxynitride, hafnium oxide, lanthanum oxide, zirconium oxide, zirconium silicon oxide, titanium oxide, tantalum oxide, barium strontium titanium oxide, barium titanium oxide, strontium titanium oxide, aluminum, etc. In some embodiments, hafnium oxide, zirconium oxide, or aluminum oxide is used as the high-k dielectric material. The cover layer can include one or more of a titanium nitride or tantalum nitride layer and is formed to prevent the work function setting metal layer to diffuse into the high-k dielectric layer. The work function setting metal layer can include one or more layers of metal or metal compound. For the N-type metal gate structure, the work function setting metal layer can include one or more of titanium, tantalum, aluminum, zirconium, hafnium, and alloys thereof. It can further include a carbide or a nitride of the metal element and the like. For the P-type metal gate structure, the work function setting metal material can include one or more of ruthenium, palladium, platinum, tungsten, and alloys thereof. It can also include carbide or nitride of the metal element and the like. The barrier material layer can include titanium nitride or tantalum nitride. The metal gate material layer can include tungsten or aluminum. In some embodiments, an interfacial layer that includes a silicon oxide material comprises (SiOx) can be formed underneath the high-k dielectric layer to improve the interface properties between the high-k dielectric layer and the semiconductor substrate 100. In some embodiments, a wetting layer, which can include titanium or titanium alloy, is formed between the barrier layer and the metal gate to improve the interface characteristics of the barrier layer and a metal gate electrode material layer. Again, for simplicity, these layers are omitted in the illustrations.

Figure 2:
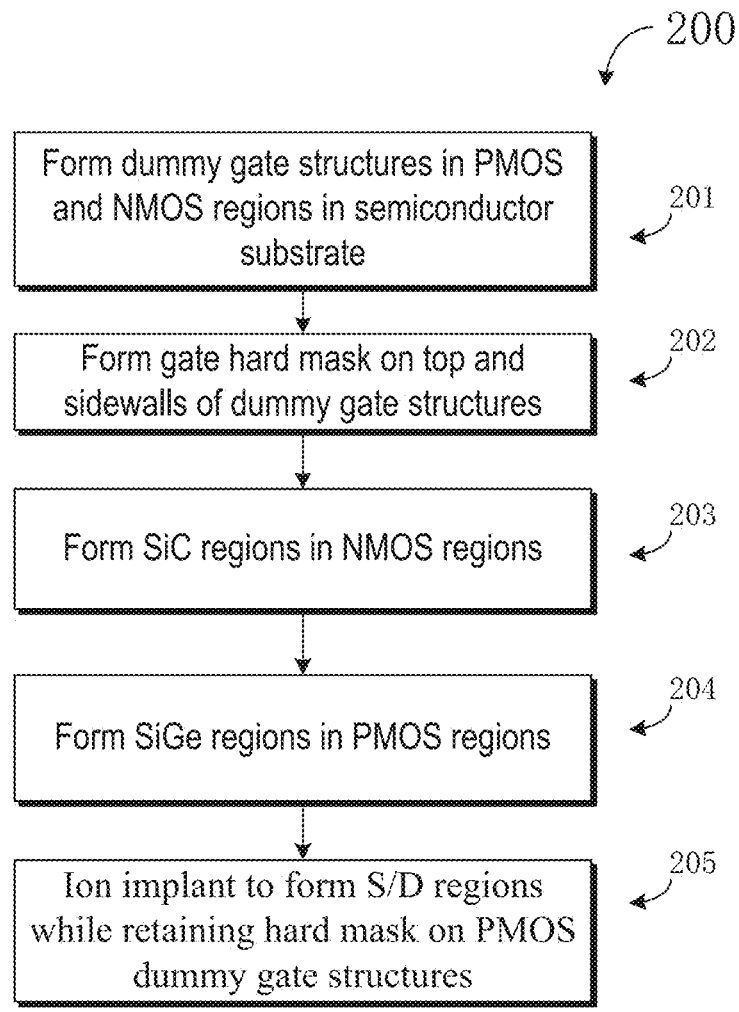
FIG. 2 is a flowchart showing a method for forming semiconductor devices according to an exemplary embodiment of the present invention.

FIG. 2 is a flowchart showing a method for forming semiconductor devices according to an exemplary embodiment of the present invention.

In step 201, dummy gate structures are formed in a PMOS region and an NMOS region in a semiconductor substrate.

In step 202, a gate hard mask layer is formed on the top and sidewalls of the dummy gate structure.

In step 203, embedded silicon carbon regions are formed on both sides of the NMOS dummy gate structures in the semiconductor substrate, and the hard mask layer on top of the NMOS dummy gate is removed.

In step 204, embedded silicon germanium regions are formed on both sides of the NMOS dummy gate structures in the semiconductor substrate.

In step 205, using ion implantation to form source/drain regions in the NMOS region and the PMOS region.

According to embodiments of the present invention, the embedded silicon carbon regions are formed before the embedded silicon germanium regions are formed. There is no need to remove the hard mask layer 101c in the PMOS region, which can reduce the thickness of the spacer material layer 107 to lower the process cost. Further, this process can reduce the difference between the removal rates of the sacrificial gate electrode material in the NMOS region and the PMOS region. As a result, the fabrication process can be simplified, process variation can be reduced, and more consistent device performance can be achieved.

The present invention has been described by the above embodiments. It is understood that the examples and embodiments described herein are for illustrative purposes only and that various modifications or changes in light thereof will be suggested to persons skilled in the art and are to be included within the spirit and purview of this application.

What is claimed is:

1. A method of manufacturing a semiconductor device, comprising:
    forming a PMOS region and an NMOS region in a semiconductor substrate;
    forming a dummy gate structure in each of the PMOS region and NMOS region;
    forming a gate hard mask layer overlying top portions and sidewalls of each of the dummy gate structures;
    forming silicon carbon (SiC) regions embedded in the semiconductor substrate on both sides of the dummy gate structure in the NMOS region;
    after forming the silicon carbon regions in the NMOS regions, forming silicon germanium (SiGe) regions embedded in the semiconductor substrate on both sides of the dummy gate structure in the PMOS region; and
    while retaining the hard mask layer on top of the dummy gate in the PMOS region, performing ion implant to form source/drain regions in the NMOS region and the PMOS region, respectively.

2. The method of claim 1, wherein the gate hard mask layer comprises nitride or oxynitride.

3. The method of claim 1, wherein forming silicon carbon regions comprises:
    forming a first sacrificial layer overlying the dummy gate structures;
    patterning a photoresist layer to expose the NMOS region;
    etching grooves in the semiconductor substrate on both sides of the dummy gate structure in the NMOS region;
    removing the photoresist layer; and
    forming silicon carbon in the grooves using epitaxial growth.

4. The method of claim 3, wherein the first sacrificial layer comprises a first nitride layer over an oxide layer.

5. The method of claim 3, further comprising forming a first cap layer over the silicon carbon regions.

6. The method of claim 5, wherein the first cap layer comprises silicon.

7. The method of claim 4, further comprising, after forming the silicon carbon regions, using a wet etching process to remove the gate hard mask layer on the dummy gate structure in the NMOS region and the nitride layer in the first sacrificial layer.

8. The method of claim 1, wherein forming silicon germanium regions comprises:
    forming a second nitride layer overlying the dummy gate structures;
    patterning a photoresist layer to expose the PMOS region;
    etching Σ-shaped grooves in the semiconductor substrate on both sides of the dummy gate structure in the PMOS region, wherein the etching process includes dry etch;
    removing the photoresist layer and performing a wet etch; and
    forming silicon germanium in the Σ-shaped grooves using epitaxial growth.

9. The method of claim 8, further comprising a seed layer formed on the bottom of the Σ-shaped grooves before forming silicon germanium in the Σ-shaped grooves.

10. The method of claim 8, further comprising forming a second cap layer over the silicon germanium regions.

11. The method of claim 10, wherein the second cap layer comprises silicon or boron-silicon.

12. The method of claim 1, wherein said embedded silicon germanium layer is doped with boron, and the embedded silicon carbon layer is doped with phosphorus.

13. The method of claim 1, further comprising:
    prior to the source/drain implantation, etching in the second nitride layer in the NMOS region to expose the region between dummy gate and the top of the dummy gate structure, and forming spacers.

14. The method of claim 13, wherein the spacers comprise the same material as the second nitride layer.

15. The method of claim 1, wherein the dummy gate structure comprises a sacrificial gate layer over a sacrificial gate dielectric layer.

16. The method of claim 1, further comprising, after the source/drain implantation formation, removing the dummy gate structure and forming a high-k dielectric and metal gate structure.

17. The method of claim 16, wherein the high-k dielectric and metal gate structure comprises a high-k dielectric layer, a cover layer, a work function setting layer, a barrier layer, and a metal gate material layer.

18. A method of manufacturing a semiconductor device, comprising:
    forming a PMOS region and an NMOS region in a semiconductor substrate;
    forming a dummy gate structure in each of the PMOS region and NMOS region, a first portion of a hard mask being disposed on top of the dummy gate structure;
    forming a second portion of the hard mask layer on sidewalls of each of the dummy gate structures;
    forming a first nitride layer covering the PMOS region and sidewall of NMOS dummy gate;
    forming silicon carbon (SiC) regions embedded in the semiconductor substrate on both sides of the dummy gate structure in the NMOS region;
    removing the first nitride layer and the hard mask layer on top of the dummy gate in the NMOS region;
    forming a second nitride layer covering the NMOS region and sidewall of PMOS dummy gate;
    forming silicon germanium (SiGe) regions embedded in the semiconductor substrate on both sides of the dummy gate structure in the PMOS region;
    removing the second nitride layer from the NMOS region; and
    while retaining the hard mask layer on top of the dummy gate in the PMOS region, performing ion implant to form source/drain regions in the NMOS region and the PMOS region, respectively.

19. The method of claim 18, wherein a single wet etch process is used to remove the first nitride layer and the hard mask layer on top of the dummy gate in the NMOS region.

20. A method of manufacturing a semiconductor device, comprising:
    forming a PMOS region and an NMOS region in a semiconductor substrate;
    forming a dummy gate structure in each of the PMOS region and NMOS region;
    forming a hard mask layer overlying top portions and sidewalls of each of the dummy gate structures, wherein a first portion of the gate hard masking layer is deposited over the sacrificial gate electrode material and then the sacrificial gate electrode is etched and patterned, and then a second gate hard mask layer is deposited and etched to form offset spacers on both sides of the dummy gate structure;
    forming a first nitride layer covering the PMOS region and sidewall of NMOS dummy gate;
    forming silicon carbon (SiC) regions embedded in the semiconductor substrate on both sides of the dummy gate structure in the NMOS region;
    removing the hard mask layer on top of the dummy gate in the NMOS region and the first nitride layer;
    forming a second nitride layer covering the NMOS region and sidewall of PMOS dummy gate;
    forming silicon germanium (SiGe) regions embedded in the semiconductor substrate on both sides of the dummy gate structure in the PMOS region;
    removing the second nitride layer from the NMOS region; and
    while retaining the hard mask layer on top of the dummy gate in the PMOS region, performing ion implant to form source/drain regions in the NMOS region and the PMOS region, respectively.

* * * * *